United States Patent [19]

Chihara et al.

[11] Patent Number: 5,330,582

[45] Date of Patent: Jul. 19, 1994

[54] METHOD FOR CLEANING ROSIN-BASE SOLDER FLUX

[75] Inventors: Machio Chihara, Nara; Jiro Mizuya, Osaka; Tatsuya Okumura, Osaka; Takashi Tanaka, Osaka, all of Japan

[73] Assignee: Arakawa Chemical Industries, Ltd., Osaka, Japan

[21] Appl. No.: 92,944

[22] Filed: Jul. 19, 1993

Related U.S. Application Data

[60] Division of Ser. No. 771,886, Oct. 7, 1991, abandoned, which is a continuation of Ser. No. 538,621, Jun. 15, 1990, abandoned.

[30] Foreign Application Priority Data

Nov. 8, 1989 [JP] Japan .................. 1-291905

[51] Int. Cl.$^5$ .................................. C23G 1/00
[52] U.S. Cl. ........................ 134/40; 252/162; 252/170; 252/174.21
[58] Field of Search .............. 252/162, 170, 174.21; 134/40

[56] References Cited

U.S. PATENT DOCUMENTS

| | | |
|---|---|---|
| 3,882,038 | 5/1975 | Clayton et al. ............ 252/164 |
| 4,627,931 | 12/1986 | Malik .......................... 252/153 |
| 4,808,235 | 2/1989 | Woodson et al. ......... 134/22.19 |
| 4,921,629 | 5/1990 | Malihi et al. .............. 252/170 |
| 4,934,391 | 6/1990 | Futch et al. ............... 134/40 |
| 4,948,531 | 8/1990 | Fuggini et al. ............ 252/544 |
| 4,983,224 | 8/1991 | Mombrun et al. ........ 134/40 |
| 5,064,557 | 11/1991 | Fusiak ....................... 252/162 |
| 5,194,173 | 3/1993 | Folkard et al. ............ 252/170 |
| 5,221,362 | 6/1993 | Porta et al. ................ 134/40 |

FOREIGN PATENT DOCUMENTS

| | | |
|---|---|---|
| 0261718 | 3/1988 | European Pat. Off. . |
| 0275987 | 7/1988 | European Pat. Off. . |
| 0412475 | 2/1991 | European Pat. Off. ......... 252/170 |
| 2846088 | 4/1980 | Fed. Rep. of Germany . |
| 2847691 | 5/1980 | Fed. Rep. of Germany . |
| 2582546 | 12/1986 | France . |
| 57-47397 | 3/1982 | Japan ........................... 252/170 |
| 2153998 | 6/1990 | Japan ........................... 252/170 |
| 3198395 | 8/1991 | Japan ........................... 252/170 |
| 1563808 | 4/1980 | United Kingdom . |
| WO8700209 | 1/1987 | World Int. Prop. O. ......... 134/40 |

Primary Examiner—Gary P. Straub
Assistant Examiner—Timothy C. Vanoy
Attorney, Agent, or Firm—Armstrong, Westerman, Hattori, McLeland & Naughton

[57] ABSTRACT

A cleaning method for removing a rosin-base solder flux, the method including bringing a cleaning agent into contact with the flux on a printed wiring board, the cleaning agent including a mixture of (A) at least one glycol ether compound represented by the formula $$R^1O-(CH_2CHO)_n-R^2 \quad\quad (1)$$
$$\phantom{R^1O-(CH_2C}|\phantom{HO)_n-R^2}$$
$$\phantom{R^1O-(CH_2C}R^3\phantom{O)_n-R^2}$$

wherein $R^1$ is a hydrogen atom or an alkyl group having 1 to 5 carbon atoms, $R^2$ is an alkyl group having 1 to 5 carbon atoms, $R^3$ is a hydrogen atom or a methyl group and n is an integer of 2 to 4, and (B) at least one nonionic surfactant.

15 Claims, No Drawings

METHOD FOR CLEANING ROSIN-BASE SOLDER FLUX

This application is a division of application Ser. No. 07/771,886 filed Oct. 7, 1991, which is a continuation of Ser. No. 07/538,621 filed Jun. 15, 1990, all abandoned.

The present invention relates to a cleaning agent for removal of rosin-base solder fluxes and more particularly to a cleaning agent for removal of rosin-base solder fluxes for assembly.

A rosin-base solder flux is used in production of modules for printed circuit boards, printed wiring boards or the like. Generally soldering is conducted to promote the union between the substrate and pins and to prevent oxidation in contact points which impairs electrical conductivity. Rosin-base fluxes are employed to accomplish the soldering as desired. After soldering, a cleaning agent is used to remove only the flux selectively and completely. When the cleaning agent fails to completely remove the flux, the remaining flux adversely affects the soldering, giving disadvantages of circuit corrosion, reduction of electrical insulating properties on board surfaces and eventual breakdown of circuits. To eliminate such potential disadvantages, the residual flux, particularly the activator present therein, is usually removed by a proper cleaning agent.

Halogenated hydrocarbon solvents such as trichloroethylene, trichlorotrifluoroethane and like flons have been heretofore used as cleaning agents for removal of rosin-base fluxes. However, stringent regulations for control of such halogenated hydrocarbon solvents have been laid down to solve or alleviate the environmental pollution problems such as the depletion of ozone layer. Currently there is an urgent demand from the electric machine industry for development of cleaning agents for fluxes as a substitute for flons.

In recent years, various halogen-free cleaning agents for fluxes have been developed, but no cleaning agent has been provided which can completely fulfil all property requirements for cleaning agents including cleaning property, characteristics meeting the environmentally acceptable standard, odor, inflammability, etc.

It is an object of the present invention to provide a halogen-free cleaning agent for removal of solder fluxes which is excellent in a cleaning property and substantially satisfactory in characteristics meeting the environmental quality standard, odor, inflammability, etc.

We conducted extensive research to achieve the foregoing object and found that a cleaning agent comprising as active ingredients a specific glycol ether compound and a nonionic surfactant surprisingly is free of all the above-mentioned problems. We have accomplished the present invention based on this novel finding.

According to the present invention, there is provided a cleaning agent for removal of a rosin-base solder flux, the cleaning agent comprising a mixture of (A) at least one glycol ether compound represented by the formula (1)

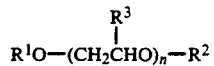 (1)

wherein $R^1$ is a hydrogen atom or an alkyl group having 1 to 5 carbon atoms, $R^2$ is an alkyl group having 1 to 5 carbon atoms, $R^3$ is a hydrogen atom or a methyl group and n is an integer of 2 to 4, and (B) a nonionic surfactant.

The present invention also provides a cleaning method for removing a rosin-base flux, the method comprising bringing the above cleaning agent into contact with the rosin-base flux on a substrate.

Examples of the glycol ether compounds of the formula (1), one of the ingredients of the cleaning agent for the rosin-base solder flux of the invention, are diethylene glycol monomethyl ether, diethylene glycol dimethyl ether, diethylene glycol monoethyl ether, diethylene glycol diethyl ether, diethylene glycol methyl ethyl ether, diethylene glycol monopropyl ether, diethylene glycol dipropyl ether, diethylene glycol methyl propyl ether, diethylene glycol ethyl propyl ether, diethylene glycol monobutyl ether, diethylene glycol dibutyl ether, diethylene glycol methyl butyl ether, diethylene glycol ethyl butyl ether, diethylene glycol propyl butyl ether, diethylene glycol monopentyl ether, diethylene glycol dipentyl ether, diethylene glycol methyl pentyl ether, diethylene glycol ethyl pentyl ether, diethylene glycol propyl pentyl ether, diethylene glycol butyl pentyl ether; the corresponding tri- or tetraethylene glycol ethers; and the corresponding di-, tri- or tetrapropylene glycol ethers, etc. These compounds are usable singly or at least two of them can be used in a suitable combination. The glycol ether compounds of the formula (1) are known or can be prepared by known methods.

The nonionic surfactant, another ingredient of the cleaning agent for rosin-base solder flux of the invention, can be selected without particular limitation from various known surfactants in so far as it has nonionic characters. Typical examples thereof are polyoxyethylene alkyl ether wherein the alkyl group has at least 6 carbon atoms, polyoxyethylene phenyl ether, polyoxyethylene alkylphenyl ether and like polyethylene glycol ether-based nonionic surfactants; polyethylene glycol monoester, polyethylene glycol diester and like polyethylene glycol ester-based nonionic surfactants; adducts of ethylene oxide and higher aliphatic amine; adducts of ethylene oxide and fatty acid amide; sorbitan fatty acid ester, sugar fatty acid ester and like polyhydric alcohol-based nonionic surfactants; fatty acid alkanol amide; the corresponding polyoxypropylene-based nonionic surfactants; and polyoxyethylene-polyoxypropylene copolymer-based nonionic surfactants. These nonionic surfactants are usable singly or at least two of them can be used in combination.

Among the above-exemplified surfactants, polyethylene glycol ether-based nonionic surfactants are desirable in view of the cleaning property and viscosity of the cleaning agent, and more preferably are known surfactants represented by the formula (2) below

$$R-O-(CH_2CH_2O)_n-H \quad (2)$$

wherein R is a straight- or branched-chain alkyl group having 6 to 20 carbon atoms, preferably 10 to 14 carbon atoms, phenyl group, or a phenyl group substituted with a straight- or branched-chain alkyl group having 7 to 12 carbon atoms and n is an integer of 2 to 20, preferably 5 to 20, more preferably 3 to 9.

While there is no specific restriction on the proportions of said glycol ether compound (A) and nonionic surfactant (B), they are usually used in a ratio of (A):(B)=about 95 to about 10 wt. %: about 5 to about 90 wt. %, preferably about 90 to about 70 wt. %: about 10 to about 30 wt. %.

The cleaning agent of the invention comprising the glycol ether compound (A) and the nonionic surfactant (B) is used for removing rosin-base fluxes, particularly those for assembly. Fluxes to be removed by the cleaning agent of the invention include inactive rosin fluxes consisting essentially of rosin, modified rosin or like rosin compound, and active rosin fluxes consisting essentially of such rosin compound and an activator such as triethanolamine hydrochloride, triethylene-tetramine hydrochloride, etc. Significant effect is produced by the cleaning agent of the invention especially when it is used for removing active fluxes for assembly.

The cleaning agent of the invention can be brought into contact with the rosin-base flux on a substrate by the following methods. The cleaning agent of the invention consisting of the active ingredients, i.e., a mixture of the glycol ether compound (A) and the nonionic surfactant (B) is used as it is, or used in the form of an aqueous solution having a concentration of the mixture of the active ingredients in the range of more than about 50% by weight but less than 100% by weight. When required, the cleaning agent of the invention may contain additives such as defoaming agent, anti-corrosion agent or the like. Such additive, if used, is added in an amount of about 0.1 wt. % or less based on the weight of the cleaning agent of the invention. The substrate may be directly immersed in the thus obtained aqueous solution or in the active ingredients per se. Alternatively the aqueous solution or the mixture of the active ingredients per se may be sprayed over the substrate to flush it therewith, or the active ingredients per se or the aqueous solution may be brought into contact with the rosin-base flux on brushing by mechanical means. A suitable method is selected from these methods.

The cleaning agent of the invention is applied under the conditions suitably determined according to the concentration of the active ingredients in the cleaning agent to be used, the kind and amount of a flux to be removed, surface area or shape of the substrate, and the like. Usually the cleaning agent of the invention is brought into contact with a flux at a temperature and for a period of time effective to remove the flux. The temperature for cleaning is usually in the range of from room temperature to about 80° C., and is preferably about room temperature. For removal of a flux on a substrate by the immersion method at, e.g. room temperature, the substrate bearing a flux is usually immersed in the cleaning agent of the invention for about 1 to about 5 minutes, whereby the flux can be eliminated effectively. The immersion at a higher temperature of not exceeding the flash point, of course, can reduce the period of time for cleaning and can improve the cleaning efficiency.

Following the cleaning operation, the substrate is then washed with water as a finishing step, whereby the cleaning agent remaining on the substrate is completely washed away. Such rinsing leads to high level of cleanness.

Such rinsing can be carried out in various ways, such as, by dipping in running water, dipping in water under application of ultrasonic wave, sparying with water or the like. Rinsing is conducted at a temperature and for a period of time effective to remove the cleaning agent and to thereby achieve a high degree of cleanness. The rinsing is usually conducted at a temperature ranging from room temperature to about 70° C. When the rinsing is conducted by showering or dipping, the time required for completion of the rinsing is usually about 30 seconds to about 5 minutes. In any event, the rinsing is continued until the substrate becomes clean enough for a particular purpose.

The cleaning agent of the invention can exhibit a flux-removing effect higher than or at least as high as conventional halogenated hydrocarbon type cleaning agents and can accomplish a high degree of flux removal.

The present invention can additionally provide the following advantages.

(a) The cleaning agent of the invention is halogen-free and does not pose the ozone depletion problem as caused by flon-type cleaning agents.

(b) The cleaning agent of the invention, containing the glycol ether compound of the formula (1), is slightly inflammable. However, an explosion-proof cleaning apparatus specially designed is not required and commercially available conventional cleaning apparatus for flons is useful as it is or as slightly modified because the glycol ether compound has an flash point of above 70° C. and is classified as "a petroleum of the third kind" stipulated by the Japanese Fire Services Act.

(c) The cleaning agent of the invention emits very low degree of odor, hence satisfactory in this regard.

According to the invention, there are provided a halogen-free solder flux-cleaning agent outstanding in a cleaning property and fully satisfactory in properties meeting environmental quality standard in respect of environmental disruption, inflammability, odor, etc. as well as a cleaning method using the solder flux-cleaning agent.

The present invention will be described below in more detail with reference to the following examples to which the scope of the invention is not limited.

EXAMPLE 1

A cleaning agent of the invention was prepared by admixing 90 parts by weight of diethylene glycol dimethyl ether and 10 parts by weight of polyethylene glycol alkyl ether nonionic surfactant (trade name "NOIGEN ET-135", a surfactant of the formula (2) wherein R is a branched chain alkyl group having 12 to 14 carbon atoms and n is 9, product of Dai-ichi Kogyo Seiyaku Co., Ltd.).

A rosin-base flux (trade name "Resin Flux #77-25", product of LONCO Co., Ltd.) was applied to the entire surface of a printed circuit board prepared from a copperclad laminate and having thereon an exposed circuit portion and a non-circuit portion coated with a solder resist, then dried at 130° C. for 2 minutes and subjected to soldering at 260° C. for 5 seconds to produce a test board.

The test board was immersed for 1 minute in the foregoing cleaning agent at room temperature and the degree of removal of the flux was inspected with the unaided eye and evaluated according to the following criteria. Table 1 shows the results.

A: The flux was removed to a satisfactory extent.
B: A little quantity of the flux remained unremoved.
C: A considerable quantity of the flux remained unremoved.

Subsequently, the test board was washed with showering water and dried at room temperature for 30 seconds, and the cleanness (concentration of the residual ions) of the test board was determined according to MIL P 28809 with use of an Omega-meter 600 SE (trade name for a product of KENKO Co., Ltd.). Table 1 shows the results.

EXAMPLES 2 to 8

The degree of removal of flux and the cleanness of the best board were evaluated in the same manner as in Example 1 with the exception of changing the composition of the cleaning agent or the cleaning temperature as shown in Table 1. Table 1 shows the results.

EXAMPLES 9 and 10

The degree of removal of flux and the cleanness of the test board were evaluated in the same manner as in Example 1 with the exception of using polyethylene glycol nonylphenyl ether nonionic surfactant (trade name "NOIGEN EA-120", a surfactant of the formula (2) wherein R is a nonylphenyl group and n is 5, product of Dai-ichi Kogyo Seiyaku Co., Ltd., Example 9), or polyethylene glycol dodecylphenyl ether nonionic surfactant (trade name "NOIGEN EA-143", a surfactant of the formula (2) wherein R is a dodecylphenyl group and n is 10, product of Dai-ichi Kogyo Seiyaku Co., Ltd., Example 10). Table 1 shows the results.

EXAMPLES 11 to 13

The degree of removal of flux and the cleanness of the test board were evaluated in the same manner as in Example 1 with the exception of using polyoxyethylene phenyl ether (the average number of moles of ethylene oxide added is 7, Example 11), polyoxyethylenesorbitan monolaurate (trade name "SORGEN TW 20", product of Dai-ichi Kogyo Seiyaku Co., Ltd., the average number of moles of ethylene oxide added is 12, Example 12) or a polyoxyethylene-polyoxypropylene block copolymer (trade name "EPAN 420", product of Dai-ichi Kogyo Seiyaku Co., Ltd. Example 13).

Table 1 shows the results.

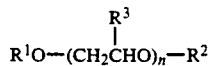

$$R^1O-(CH_2CHO)_n-R^2 \qquad (1)$$
with $R^3$ on the middle carbon wherein $R^1$ is a hydrogen atom or an alkyl group having 1 to 5 carbon atoms, $R^2$ is an alkyl group having 1 to 5 carbon atoms, $R^3$ is a hydrogen atom or a methyl group and n is an integer of 2 to 4, and
(B) at least one nonionic surfactant.

2. A cleaning method according to claim 1 wherein the nonionic surfactant is a surfactant represented by the formula (2)

$$R-O-(CH_2CH_2O)_n-H \qquad (2)$$

wherein R is a straight- or branched-chain alkyl group having 6 to 20 carbon atoms, phenyl group or a phenyl group substituted with a straight- or branched- chain alkyl group having 7 to 12 carbon atoms and n is an integer of 2 to 20.

3. A cleaning method according to claim 1 wherein the mixture comprises about 95 to about 10 wt. % of the glycol ether compound of the formula (1) and about 5 to 90 wt. % of the nonionic surfactant.

4. A cleaning method according to claim 1 wherein the mixture comprises about 90 to about 70 wt. % of the glycol ether compound of the formula (1) and about 10 to about 30 wt. % of the nonionic surfactant.

5. A cleaning method according to claim 1 wherein the cleaning agent is brought into contact with the rosin-base solder flux on a printed wiring board for a time period and at a temperature effective for removal of the flux.

6. A cleaning method according to claim 1 wherein the cleaning agent is brought into contact with the rosin-base solder flux at about room temperature.

7. A cleaning method according to claim 1 which further comprises the step of washing the printed wiring board with water.

8. A cleaning method for removing a rosin-base solder flux, the method comprising bringing a cleaning agent into contact with the flux on a printed wiring board, the cleaning agent consisting essentially of water and a mixture of

TABLE 1

| | Cleaning agent composition | | Cleaning temp. | Degree of removal | Degree of cleaning Contamination of equivalent Nacl ($\mu$g/inch$^2$) |
|---|---|---|---|---|---|
| | Glycol ethers (part by weight) | Surfactant parts by weight | | | |
| Ex. 1 | DEGDME (9) | NOIGEN ET-135 (1) | Room temp. | A | 5.0 |
| Ex. 2 | DEGDME (5) | NOIGEN ET-135 (5) | Room temp. | A | 4.9 |
| Ex. 3 | DEGDME (2) | NOIGEN ET-135 (8) | Room temp. | B | — |
| Ex. 4 | DEGDME (2) | NOIGEN ET-135 (8) | 50° C. | A | 5.1 |
| Ex. 5 | DEGDEE (9) | NOIGEN ET-135 (1) | Room temp. | A | 5.2 |
| Ex. 6 | DEGMBE (9) | NOIGEN ET-135 (1) | Room temp. | A | 4.8 |
| Ex. 7 | DPGMME (9) | NOIGEN ET-135 (1) | Room temp. | A | 5.3 |
| Ex. 8 | TPGMME (9) | NOIGEN ET-135 (1) | Room temp. | A | 5.1 |
| Ex. 9 | DEGDME (9) | NOIGEN EA-120 (1) | Room temp. | A | 4.9 |
| Ex. 10 | DEGDME (9) | NOIGEN EA-143 (1) | Room temp. | A | 5.0 |
| Ex. 11 | DEGDME (9) | PEO-ph (1) | Room temp. | A | 5.0 |
| Ex. 12 | DEGDME (9) | SORGEN TW 20 (1) | Room temp. | A | 5.2 |
| Ex. 13 | DEGDME (9) | EPAN 420 (1) | Room temp. | A | 5.2 |

(Note)
DEGDME: Diethylene glycol dimethyl ether
DEGDEE: Diethylene glycol diethyl ether
DEGMBE: Diethylene glycol monobutyl ether
DPGMME: Dipropylene glycol monomethyl ether
TPGMME: Tripropylene glycol monomethyl ether
PEO-ph: Polyoxyethylene phenyl ether

We claim:

1. A cleaning method for removing a rosin-base solder flux, the method comprising bringing a cleaning agent into contact with the flux on a printed wiring board, the cleaning agent consisting essentially of a mixture of
   (A) at least one glycol ether compound represented by the formula (A) at least one glycol ether compound represented by the formula $$R^1O-(CH_2CHO)_n-R^2 \quad\text{with substituent } R^3 \tag{1}$$

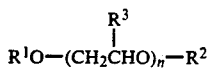

wherein $R^1$ is a hydrogen atom or an alkyl group having 1 to 5 carbon atoms, $R^2$ is an alkyl group having 1 to 5 carbon atoms, $R^3$ is a hydrogen atom or a methyl group and n is an integer of 2 to 4, and (B) at least one nonionic surfactant.

9. A cleaning method according to claim 8 wherein the nonionic surfactant is a surfactant represented by the formula (2)

$$R-O-(CH_2CH_2O)_n-H \tag{2}$$

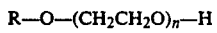

wherein R is a straight- or branched-chain alkyl group having 6 to 20 carbon atoms, a phenyl group or a phenyl group substituted with a straight- or branched-chain alkyl group having 7 to 12 carbon atoms and n is an integer of 2 to 20.

10. A cleaning method according to claim 8 wherein the mixture comprises about 95 to about 10 wt. % of the glycol ether compound of the formula (1) and about 5 to 90 wt. % of the nonionic surfactant.

11. A cleaning method according to claim 8 wherein the mixture comprises about 90 to about 70 wt. % of the glycol ether compound of the formula (1) and about 10 to about 30 wt. % of the nonionic surfactant.

12. A cleaning method according to claim 8 wherein the cleaning agent contains said mixture of the active ingredients (A) and (B) at a concentration of more than about 50% by weight but less than 100% by weight.

13. A cleaning method according to claim 8 wherein the cleaning agent is brought into contact with the rosin-base solder flux on a printed wiring board for a time period and at a temperature effective for removal of the flux.

14. A cleaning method according to claim 8 wherein the cleaning agent is brought into contact with the rosin-base solder flux at about room temperature.

15. A cleaning method according to claim 8 which further comprises the step of washing the printed wiring board with water.

* * * * *